(12) United States Patent
Larrinaga

(10) Patent No.: US 7,828,946 B2
(45) Date of Patent: Nov. 9, 2010

(54) ARC EVAPORATOR WITH A POWERFUL MAGNETIC GUIDE FOR TARGETS HAVING A LARGE SURFACE AREA

(75) Inventor: Josu Goikoetxea Larrinaga, Bizkaia (ES)

(73) Assignee: Fundacion Tekniker, Eibar (ES)

( * ) Notice: Subject to any disclaimer, the term of this patent is extended or adjusted under 35 U.S.C. 154(b) by 826 days.

(21) Appl. No.: 11/473,440

(22) Filed: Jun. 23, 2006

(65) Prior Publication Data

US 2006/0237309 A1 Oct. 26, 2006

Related U.S. Application Data

(63) Continuation of application No. 10/472,575, filed as application No. PCT/ES01/00119 on Mar. 27, 2001, now abandoned.

(51) Int. Cl.
*C23C 14/32* (2006.01)
(52) U.S. Cl. ............................. 204/298.41; 204/192.38
(58) Field of Classification Search ............ 204/192.38, 204/298.41, 298.19, 298.2, 298.12
See application file for complete search history.

(56) References Cited

U.S. PATENT DOCUMENTS

| | | | | |
|---|---|---|---|---|
| 4,839,011 A | * | 6/1989 | Ramalingam et al. | 204/192.38 |
| 4,891,560 A | * | 1/1990 | Okumura et al. | 315/111.41 |
| 5,298,136 A | * | 3/1994 | Ramalingam | 204/192.38 |
| 5,421,978 A | * | 6/1995 | Schuhmacher et al. | 204/298.09 |
| 6,413,387 B1 | * | 7/2002 | Shi et al. | 204/192.38 |
| 6,440,282 B1 | * | 8/2002 | Wada et al. | 204/298.2 |

* cited by examiner

*Primary Examiner*—Rodney G McDonald
(74) *Attorney, Agent, or Firm*—Michael Best & Friedrich LLP

(57) ABSTRACT

A magnetic guide is presented that controls an electric arc between an anode and a cathode, which may be a target, over the whole cathode surface. The magnetic guide may be included in an arc evaporator and may include a first magnetic system having a group of permanent magnets located on the periphery of the evaporator or target, so that magnetization is perpendicular to the surface of the target. The magnetic guide may also include a second magnetic system that includes an electromagnet located at the rear of the target housed in an electrically insulating body at a distance from the target, with at least one of its magnetic poles parallel to the surface of the target, so that the combined action of the two magnetic systems provides uniform use or consumption of the target.

14 Claims, 6 Drawing Sheets

ARC EVAPORATOR WITH A POWERFUL MAGNETIC GUIDE FOR TARGETS HAVING A LARGE SURFACE AREA

This application is a continuation of U.S. patent application Ser. No. 10/472,575 filed 25 Sep. 2003, now abandoned which claims priority of International Patent Application No. PCT/ES01/00119 filed 27 Mar. 2001.

OBJECT OF THE INVENTION

The present invention relates to an arc evaporator, that is a machine intended to evaporate a material, an electrical conductor, so that said material, in vapour form, can be displaced within a vacuum medium in order to be deposited on the surface of the piece to be clad.

The object of the invention is to obtain an arc evaporator which, including a powerful magnetic guide, permits the cathodic point of the arc to be guided in an infinity of different trajectories, capable of being individually selected and which encompass the whole surface area of the target, for the purpose of achieving uniform use thereof. Also, the powerful magnetic guide causes a strangulation or narrowing of the cathodic point, which increases the temperature and ionisation of the emitted material, facilitating the obtaining of good quality coatings.

Furthermore, the powerful magnetic guide contributes to increased reliability of the arc evaporator, by making it impossible for the arc to be displaced accidentally to a different point of the evaporation surface area.

BACKGROUND OF THE INVENTION

As has already been remarked in the previous paragraph, arc evaporators are machines for evaporating a material, an electrical conductor, and emit it inside a vacuum bell jar in form of a vapour which can be displaced through the interior thereof. Usually the material to be evaporated is in plate form, one of the faces of which is cooled by water and the other is directed toward the interior of the vacuum bell jar, in a position facing the piece on which it is desired to deposit the emitted vapours, the evaporation of the material being caused by provoking a direct current electric arc, of approximately 22 volts and 80 amperes, between a cooled electrode which acts as anode and the conductive plate which it is of interest to evaporate and which acts as cathode, a small quantity of gas necessary for maintaining the arc being habitually introduced additionally in the vacuum chamber.

In a more specific manner, the electric arc acts on the surface of the plate to be evaporated in a concentrated manner on a single point, the cathodic point which is randomly displaced over the external surface area of the plate, which produces a not very homogeneous consumption of the plate, or what is the same thing, good use is not made of the constituent material of said plate, the cost of which is very high.

To remedy this problem of lack of homogeneity in the consumption of the plate it is endeavoured to control and direct the movement of the electric arc, magnetic guides being used to such an end which produce fields that can modify the track of the electric arc in a controlled manner.

Different solutions exist at the present time for said magnetic guides, all of them intended to control the movement of the arc on the cathode with the purpose of optimising homogeneous consumption, among those worthy of mention being the following ones:

U.S. Pat. No. 4,673,477 describes a magnetic guide which employs a permanent magnet which is displaced, by mechanical means, in the rear part of the plate to be evaporated, in such a way that the variable magnetic field which this permanent magnet generates produces a guidance of the electric arc on the cathode. This machine also incorporates optionally a magnetic winding which surrounds the cathode plate for the purpose of strengthening or weakening the force of the magnetic field in a direction perpendicular to the active surface area of the cathode so improving the guidance of the electrode. The problem which this machine has, is that the magnetic system of moveable permanent magnets is very complex mechanically and therefore susceptible to breakdown.

U.S. Pat. No. 4,724,058 relates to a magnetic guide which incorporates some coils placed in the rear part of the cathode plate, which guide the electric arc in a single direction parallel to that which the coil follows. For the purpose of reducing the effect of preferential consumption in a single track, methods are used which endeavour to weaken the guidance effect of the magnetic field so that upon the latter a random component is superimposed. In short, it has been foreseen that the magnetic field generated by the coil is connected and disconnected so that most of the time the arc is displaced on the cathode in a random manner, and a very small part is guided by the magnetic field. The problem with this machine is that, finally, the guidance takes place during a very short time and the rest is random whereby precise and efficient control of the consumption of the cathode plate cannot be guaranteed.

U.S. Pat. No. 5,861,088 describes a magnetic guide which includes a permanent magnet located in the centre of the target and in the rear face thereof, and a coil which surrounds the aforementioned permanent magnet, the assembly constituting a magnetic field concentrator. The system is completed with a second coil placed on the exterior of the evaporator. The problem with this machine is that the magnetic field generated is weak and therefore also the guidance which it effects on the electric arc.

U.S. Pat. No. 5,298,136 describes a magnetic guide for thick targets in circular evaporators, which comprises two coils and a magnetic piece of special configuration which adapts to the edges of the target to be evaporated, in such a way that the whole works with a single magnetic element, with two magnetic poles. Although this configuration allows displacement of the track of the arc to a certain degree, it is not capable of displacing the track thereof up to the external edge of the target or a small distance therefrom for which in order to make efficient use of the material of the cathode, the guide has to be sufficiently weak to allow a random component to be superimposed on the movement forced magnetically.

In brief, all the systems of magnetic guides known present the problem that if it is desired to obtain uniform consumption over the whole surface area of the cathode, the arc has to be capable of movement with a certain freedom and therefore weak guides should be used (of reduced magnetic intensities), whereby it is not possible to maintain the control over the track of the arc at all times.

If on the contrary very powerful magnetic guides are employed, it is not possible to achieve uniform consumption of the whole surface area of the target or cathode.

DESCRIPTION OF THE INVENTION

The arc evaporator which the invention propounds resolves in a fully satisfactory manner the problem outlined above, in each and every one of the different aspects mentioned, through the incorporation of a powerful magnetic guide but which, by its special configuration, allows the cathodic point of the arc to be guided in an infinity of different individually selectable trajectories and which encompass the whole surface area of the target, including the edges and centre thereof, a uniform consumption of the target or cathode being achieved.

To this end and more specifically, said evaporator centres its characteristics in that its magnetic guide is formed by two independent magnetic systems, that is, by four magnetic poles, which allows juggling with the magnetic intensity values of both systems and managing cancellation of the perpendicular component of the resultant magnetic field at the desired point of the surface area of the target, thereby achieving the guidance of the arc according to whatever track, from the centre of the target to its outer edges.

Thus, by having a system which allows the guidance of the arc to be guaranteed at all points of the target, it is possible to use strong magnetic systems which therefore allow application of high magnetic intensities on each of the trajectories, which causes an important narrowing of the cathodic point, which implies a major increase in temperature and degree of ionisation of the emitted material, greatly facilitating the obtaining of good quality coatings. It also increases the reliability of the evaporator, since the powerful magnetic fields hold a point firmly to which the arc is applied on the selected track, avoiding the possibility of accidental displacement thereof over some unplanned area.

Specifically, the two magnetic systems which constitute the guide can be a system of very powerful permanent magnets and a system of electromagnets, also very powerful, which guarantee a very high magnetic intensity and therefore good control over the electric arc but, at the same time it is possible to act on the electromagnets varying their intensity, which produces a change in the track of the arc over the target. Therefore, with this system one obtains a strong magnetic guide which also allows variation, and therefore control, of the trajectories of the arc on the target achieving in this way uniform consumption of the whole surface area thereof.

The system of permanent magnets could also be substituted by a second system of electromagnets, since the operation of the whole would be similar.

DESCRIPTION OF THE DRAWINGS

To complete the description that is being made and with the object of assisting in a better understanding of the characteristics of the invention, in accordance with a preferred example of practical embodiment thereof, said description is accompanied with a set of drawings, as an integral part thereof, wherein are shown by way of illustration and not restrictively, the following.

PREFERRED EMBODIMENT OF THE INVENTION

Figure 1:
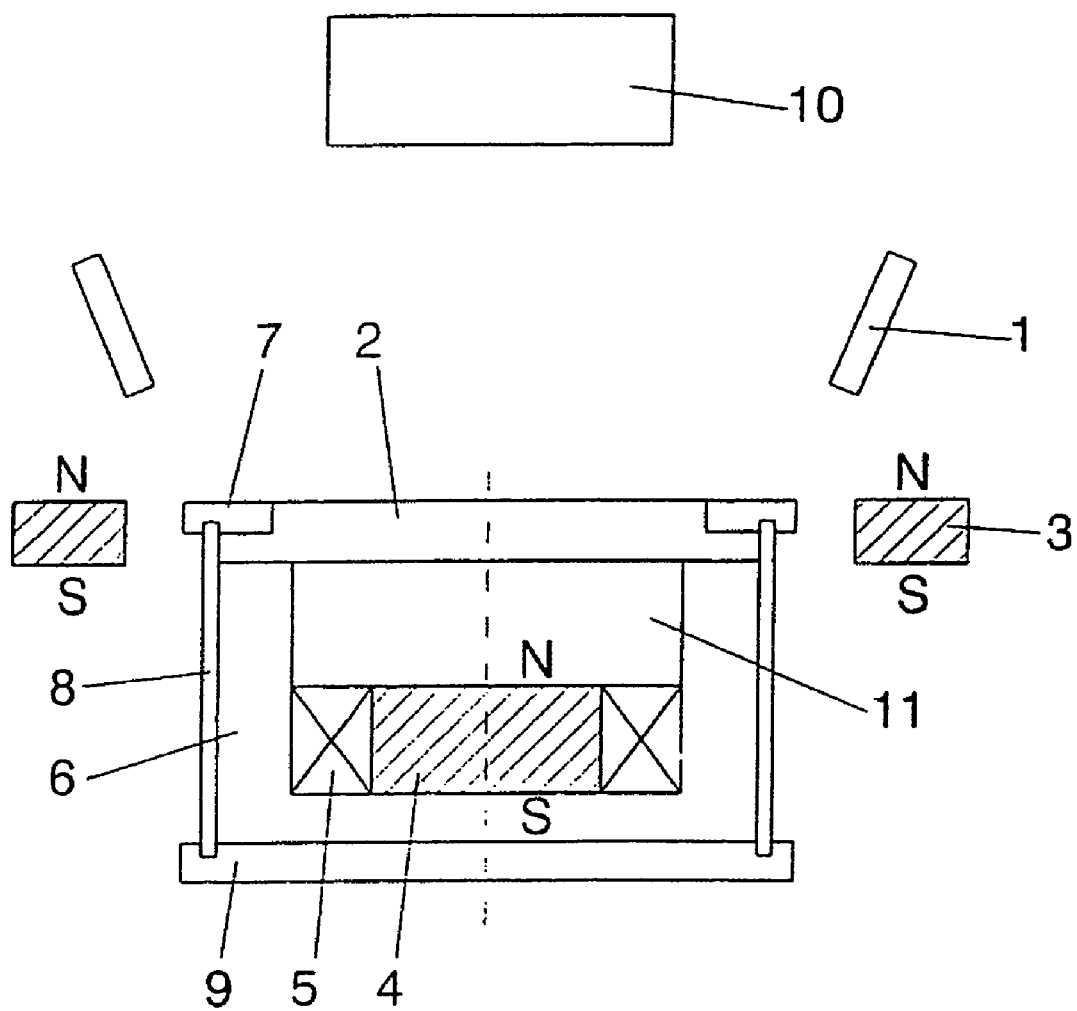
FIG. 1 shows a schematic representation in cross-section of a rectangular arc evaporator with powerful magnetic guide embodied in accordance with the object of the present invention.
Figure 2:
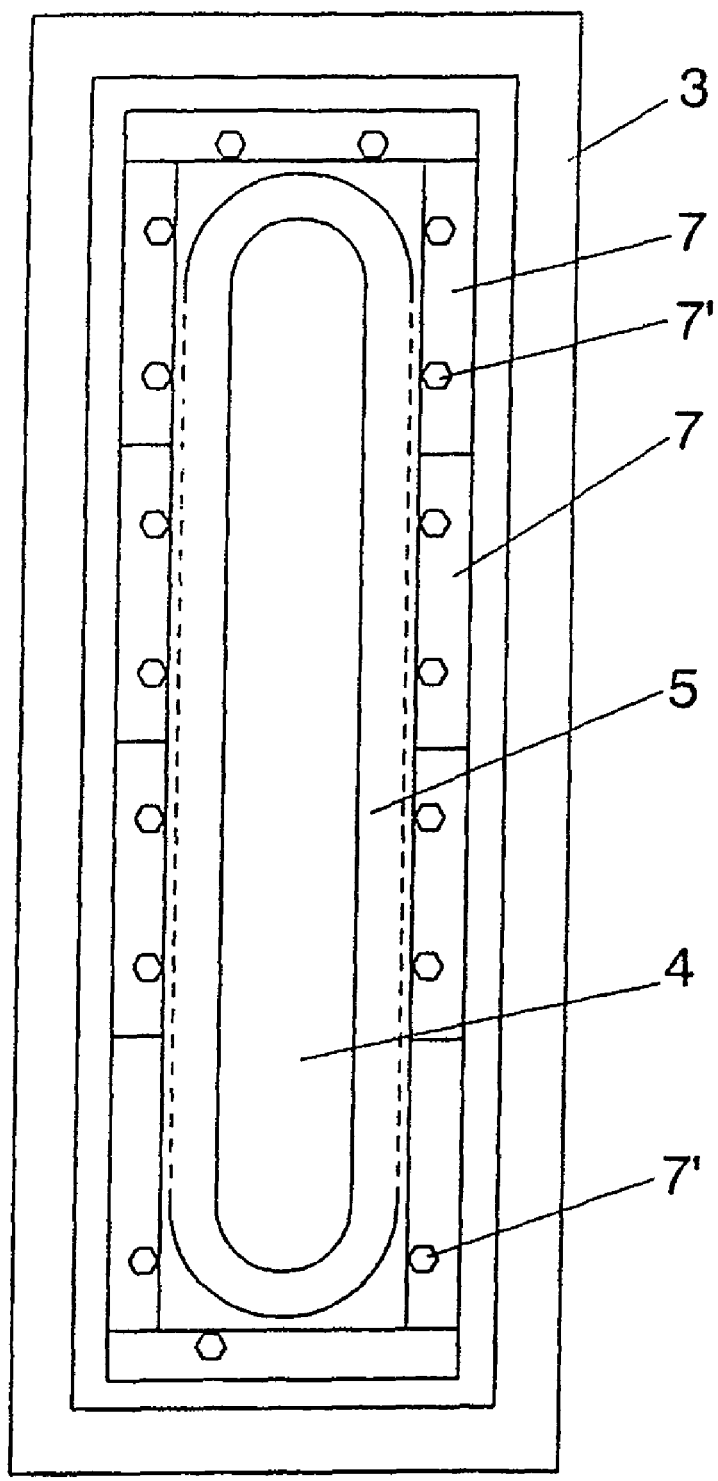
FIG. 2 shows, also according to a schematic representation, a plan view of the evaporator of the previous figure.

In the light of the figures mentioned, and especially of FIGS. 1 and 2, it can be observed how in the arc evaporator which the invention propounds, there is an anode (1) and a cathode or target (2), as well as a magnetic guide, so that the direct current electric arc is formed, logically, between anode (1) and target (2) which acts as cathode of said electric arc and therefore emits material from its surface area.

To assure that the point of target (2) on which the arc acts (point at which the perpendicular component of the magnetic field is zero) is displaced over the whole surface area of said target (2) in a homogeneous manner, a magnetic guide is used comprising two independent magnetic systems, a first magnetic system formed by a group of permanent magnets (3) located on the periphery of the evaporator and so that their magnetization is perpendicular to the surface of the target, and a second magnetic system constituted by a single electromagnet (4-5) located in the rear part of the target, at a certain distance from the latter, the magnetic pole nearest to target (2) being parallel to the surface of the aforementioned target.

The electromagnet (4-5) located in the rear part of target (2) consists of a core (4) of a material of high magnetic permeability and scant coercive force, such as wrought iron, surrounded by an electric coil (5) which serves to generate the magnetic flux necessary to magnetize the wrought iron, said core (4) having a rectangular cross-section, shown in FIG. 1, with the two magnetic poles arranged parallel to the surface of target (2).

In more specific terms, electromagnet (4-5) is housed and perfectly fitted within body (6) of the evaporator, which has the form of a species of trough to the mouth of which is coupled cathode or target (2) which is secured with the collaboration of screws, not shown, electromagnet (4-5) being located below the target and at a certain distance from the latter to guarantee that the magnetic field is sufficiently homogeneous on the surface area of the target, a chamber (11) being defined in this way between target (2) and electromagnet (4-5) which can be used to emplace the systems necessary to assure appropriate cooling of target (2), as well as the rest of the components of the evaporator. As has been mentioned, the height of this cold chamber is determined by the need to have a certain distance between the upper face of the ferromagnetic core and the evaporation surface, so that the magnetic field on the latter is sufficiently uniform.

The assembly is completed with an external base (9), some lateral and external hangers (8) and a barrier of slats (13) which forms a frame which, as well as protecting the screws that fasten target (2) to body (6), confine the arc inside the target, so defining the evaporation surface area. In turn, the insulating slats (13) are secured by appropriately electrically isolated screws (7'). All these elements, slats (13), hangers (8) and base (9) are obtained from materials electrically insulating at high temperature, such as alumina, vitroceramics, boron nitride or PTFE, and which form an impediment for the arc to form on undesired surfaces. These pieces require periodic maintenance since in the course of arc operation they are gradually coated with electrically conductive materials, whereby their effectiveness for avoiding the formation of the arc diminishes.

Furthermore magnets (3) which configure the first magnetic system on the periphery of body (6) of the evaporator, at the level of target (2), are implemented in external permanent magnets (3) which have to be of reduced height and located in such a way that the centre line thereof coincides with the middle plane defined between the initial surface of target (2) and the surface which it will have at the end of its useful life, also said magnets should be of the greatest possible power, for which reason they will be of maximum width and will be obtained on a basis of materials with high coercive force, like for example SmCo, NdFeB or hard ferrites.

The mechanism described is completed with a vacuum chamber or bell jar, not shown in the drawings, inside which is mounted piece (10) to be coated with the material evaporated from target (2).

Figure 3:
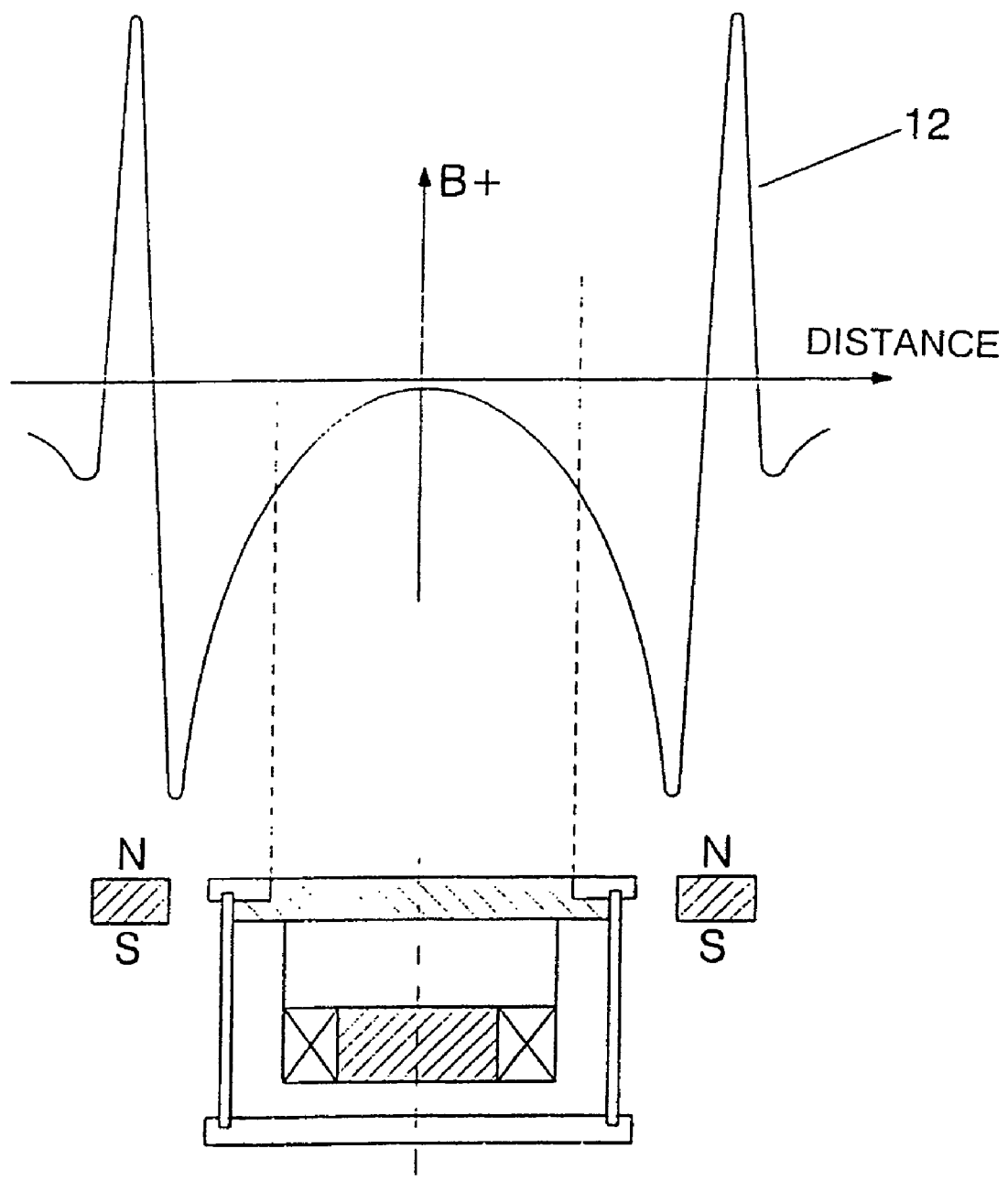
FIGS. 3, 4 and 5 reproduce the cross-section of FIG. 1, to which in FIG. 3 a graph has been added of the vertical component of the magnetic field created by the externally located permanent magnets, in FIG. 4 a similar graph but corresponding to the magnetic fields created by the electromagnet located in the rear part of the target when different electric currents are applied in the electromagnet and in FIG. 5 the magnetic fields created by the permanent magnets located on the exterior of the evaporator plus the electromagnet located in the rear part of the target, likewise when different electric currents are applied in the electromagnet.

In FIG. 3 a graph (12) is shown which corresponds to the vertical component of the magnetic field created by permanent magnets (3) located on the exterior of body (6) of the evaporator and at a level with the surface of target (2).

Figure 4:
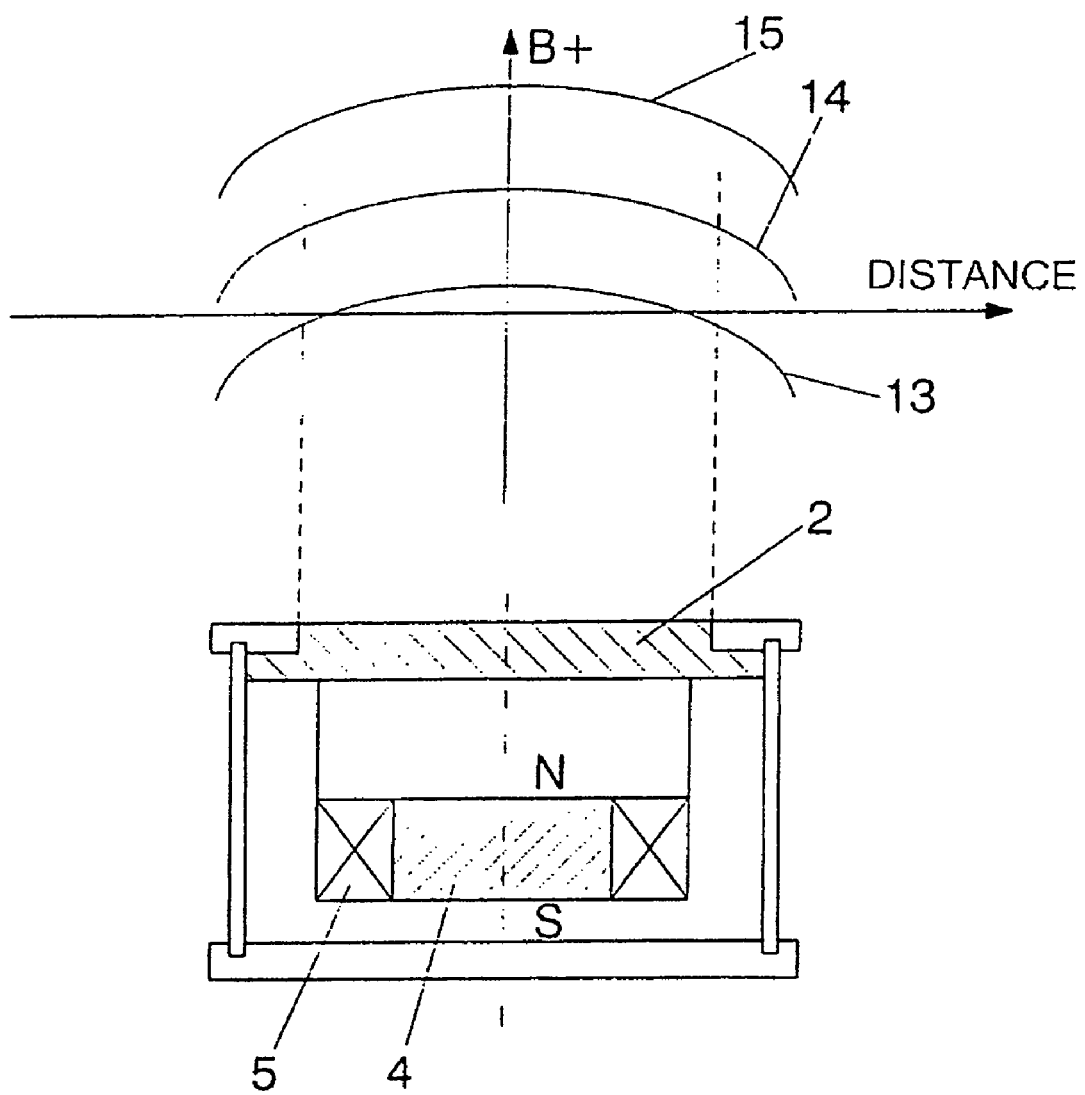

In FIG. 4, graphs (13) (14) and (15) shown, correspond to the vertical components of the magnetic fields created by electromagnet (4-5) located behind the surface of target (2) inside body (6) of the evaporator, when different electric currents are applied to said electromagnet (4-5).

Figure 5:
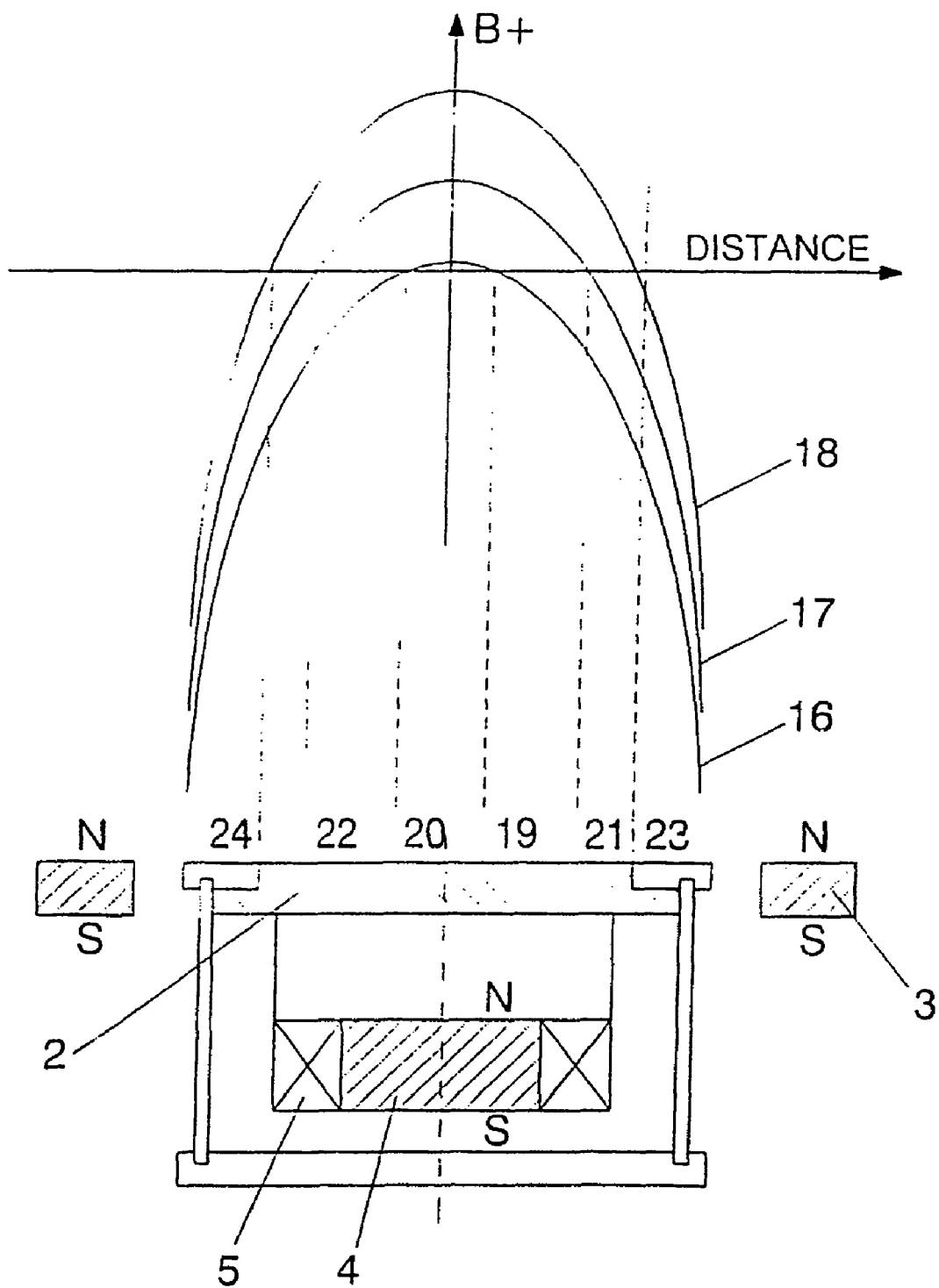

Finally in FIG. 5 graphs (16) (17) and (18) are shown, corresponding to the vertical components of the magnetic fields created on the surface of target (2) both by the permanent magnets located on the exterior of the evaporator on the surface of target (2) and by electromagnet (4-5) located in the rear part of target (2), when applying different electric currents to electromagnet (4-5).

As can be appreciated, this graph is the result of adding the magnetic field created by electromagnet (4-5) to the magnetic field created by permanent magnets (3) and gives as a result a vertical translation of the graph corresponding to the permanent magnets, so that now a part of this graph is situated in the positive part of the vertical axis. Essentially the cathodic point follows a track over the surface of the target which is constituted by the points in which the value of the vertical component of the magnetic field is zero and thus for example if the power applied to the electromagnet be adjusted in such a way that the corresponding graph were that shown with number 16, the track of the cathodic point over the target would pass through points 19 and 20, whilst if the current is adjusted so that the corresponding graph was 18, the cathodic point would pass through points 23 and 24 on the surface of the target in an intermediate track (17) the cathodic points would be 21 and 22.

Figure 6:
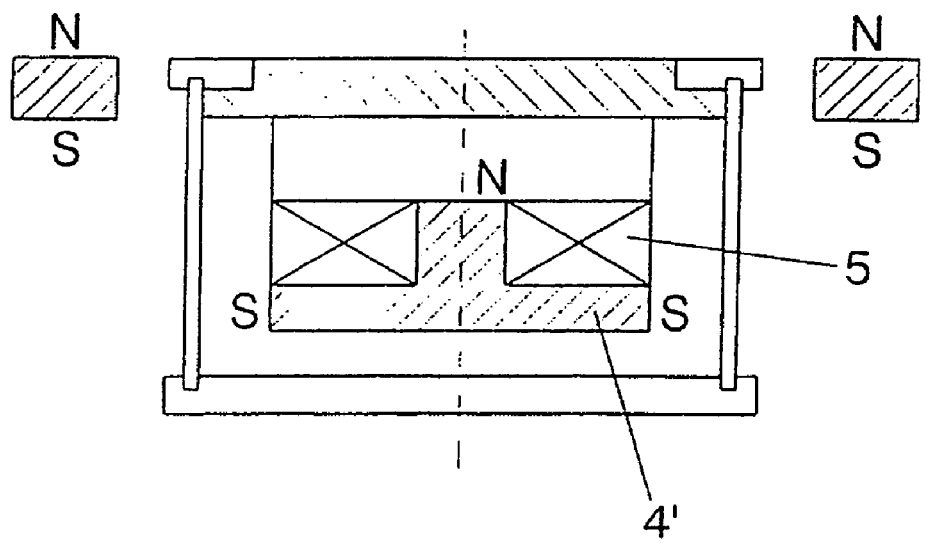
FIG. 6 shows a similar cross-section to that of FIG. 1, according to a variant of embodiment in which the form of the electromagnet permeable material has been altered.

As is observed in FIG. 6, in another practical embodiment, the magnetic core (4) can have a T-shaped section with one of its poles parallel to target (2) and the other perpendicular to the target, this configuration allowing a greater intensity to be obtained of the magnetic field on the surface of the evaporator, as well as a greater extension of the magnetic field in the horizontal plane, which allows the distance to be reduced between the upper face of ferromagnetic core (4) and target (2).

Figure 7:
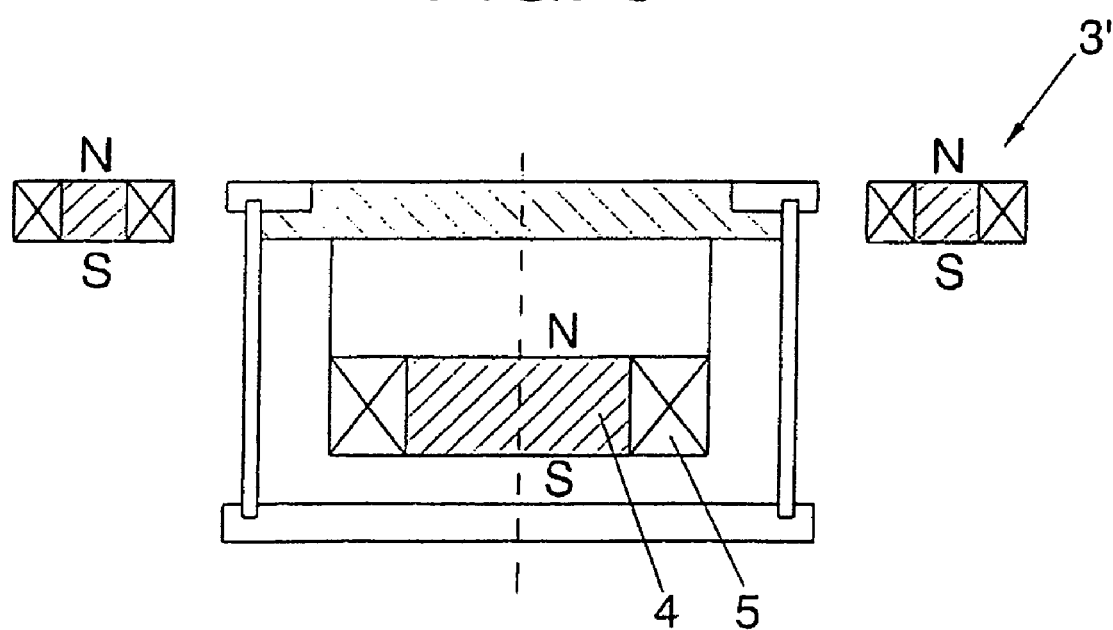
FIG. 7 shows, finally, another cross-section similar to that of FIG. 1 but corresponding to another variant of embodiment of the invention wherein the permanent magnets on the exterior of the evaporator are each replaced by an electromagnet.

Permanent magnets (3) may be replaced by electromagnets (3'), of similar structure to that of electromagnets (4-5), as may be observed in the embodiment shown in FIG. 7. Further, the arc evaporator may include a magnetic guide with two independent magnetic systems, one system including permanent magnets (3) and electromagnets (3') and the other system including electromagnets (4-5).

The invention claimed is:

1. An arc evaporator comprising a magnetic guide for targets having a surface area, which incorporate an anode and a cathode or a target, housed within a vacuum bell jar, in which is housed a piece to be coated with material evaporated from the target by means of an electric arc produced between the anode and the cathode, in which the magnetic guide controls and directs a movement of the electric arc comprising said magnetic guide including two independent magnetic systems, which include four magnetic poles that allow the resultant magnetic intensity to be varied so that the electric arc follows a track desired on the target, the first magnetic system being constituted by a group of permanent magnets located on the periphery of the evaporator, in a disposition coplanar with the target, with its magnetization perpendicular to a surface of said target, and the first magnetic system having an upper magnetic pole; and the second magnetic system constituted by an electromagnet located in a rear part of the target, at a distance from the latter, the second magnetic system having an upper magnetic pole or a magnetic pole nearer the target being arranged parallel to the surface of the target and including a magnetization perpendicular to the surface of said target and parallel to the permanent magnets in the periphery such that the upper pole of the both first and second magnetic systems have the same polarity.

2. The arc evaporator according to claim 1, wherein the electromagnet is housed within a body that includes a trough, having a mouth to which is secured the target, which is distanced from the electromagnet to permit an installation of cooling systems for the target, and the body having a perimeter frame, a barrier of slats, a plurality of hangers and a rear base that are electrically insulating and selected from a group comprising alumina, vitroceramic, boron nitride and PTFE.

3. The arc evaporator according to claim 1, wherein the electromagnet includes a ferromagnetic core located in correspondence with a central area of an evaporation surface, and wherein an electric coil is arranged around the ferromagnetic core, which generates a magnetic flux to magnetize the core.

4. The arc evaporator according to claim 3, wherein the ferromagnetic core includes a rectangular cross-section with two magnetic poles arranged parallel to the surface of the target.

5. The arc evaporator according to claim 3, wherein the ferromagnetic core includes a T-shaped cross-section with two magnetic poles, wherein one of the poles is parallel to the target, and the other one of the poles is perpendicular to the target.

6. The arc evaporator according to claim 1, wherein the electromagnet includes a core with a T-shaped cross-section with two magnetic poles, such that one of the poles is parallel to the target, and the other one of the poles is perpendicular to the target.

7. The arc evaporator according to claim 1, further comprising permanent magnets of reduced height and located so that a centre line of the magnets coincides with a middle plane that is defined as being between a starting point on the surface of the target and a point on a surface defining an end of the target's useful life, the permanent magnets having a coercive force and selected from a group comprising SmCo, NdFeB and hard ferrites.

8. The arc evaporator according to claim 1, wherein the magnetic systems include a plurality of electromagnets.

9. An arc evaporator comprising:
an anode;
a cathode target; and
a magnetic guide system comprising:
- a first magnetic guide comprising a plurality of permanent magnets located at a periphery of the evaporator, coplanar with the cathode target, and including a magnetization perpendicular to a surface of the target, and having an upper pole; and
- a second magnetic guide independent of the first magnetic guide and comprising an electromagnet located at a rear of the target, which includes an upper magnetic pole parallel to the surface of the target and including a magnetization perpendicular to the surface of said target and parallel to the magnets in the periphery such that the upper poles of both the first magnetic guide and the second magnetic guide have the same polarity.

10. The arc evaporator according to claim 9 further comprising a body located within the evaporator and housing the second magnetic guide.

11. The arc evaporator according to claim 9, wherein the electromagnet further comprises a ferromagnetic core.

12. The arc evaporator according to claim 11, wherein the ferromagnetic core comprises a rectangular cross-section including two magnetic poles parallel to the surface of the target.

13. The arc evaporator according to claim 11, wherein the ferromagnetic core comprises a T-shaped cross-section including first and second magnetic poles, wherein the first pole is parallel to the target and the second pole is perpendicular to the target.

14. The arc evaporator according to claim 9, wherein the first magnetic guide further comprises an electromagnet.

* * * * *